(12) United States Patent
Arnold et al.

(10) Patent No.: US 6,986,199 B2
(45) Date of Patent: Jan. 17, 2006

(54) LASER-BASED TECHNIQUE FOR PRODUCING AND EMBEDDING ELECTROCHEMICAL CELLS AND ELECTRONIC COMPONENTS DIRECTLY INTO CIRCUIT BOARD MATERIALS

(75) Inventors: Craig B. Arnold, Alexandria, VA (US); Alberto Pique, Crofton, MD (US); Ray Auyeung, Alexandria, VA (US); Michael Nurnberger, Alexandria, VA (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 0 days.

(21) Appl. No.: 10/868,448

(22) Filed: Jun. 9, 2004

(65) Prior Publication Data
US 2005/0006136 A1    Jan. 13, 2005

Related U.S. Application Data

(60) Provisional application No. 60/478,471, filed on Jun. 11, 2003.

(51) Int. Cl.
*H01R 43/00*   (2006.01)
(52) U.S. Cl. .............................. 29/832; 29/825; 29/829
(58) Field of Classification Search ................ 174/257, 174/261, 52.2; 29/832, 829, 825
See application file for complete search history.

(56) References Cited

U.S. PATENT DOCUMENTS

| | | | |
|---|---|---|---|
| 4,889,777 A | 12/1989 | Akuto | |
| 5,141,602 A * | 8/1992 | Chen et al. | 205/103 |
| 5,180,645 A | 1/1993 | More | |
| 5,389,196 A * | 2/1995 | Bloomstein et al. | 216/66 |
| 5,540,742 A | 7/1996 | Sangyoji et al. | |
| 5,624,468 A | 4/1997 | Lake | |
| 6,045,942 A | 4/2000 | Miekka et al. | |
| 6,068,782 A | 5/2000 | Brandt et al. | |
| 6,137,671 A | 10/2000 | Staffiere | |
| 6,177,151 B1 | 1/2001 | Chrisey et al. | |
| 6,239,977 B1 | 5/2001 | Price et al. | |
| 6,487,084 B1 | 11/2002 | Chu et al. | |
| 2003/0155328 A1 * | 8/2003 | Huth et al. | 216/65 |

OTHER PUBLICATIONS

A. Piqué, C.B. Arnold, B. Pratap, R.C.Y. Auyeung, H.S. Kim and D.W. Weir, "Laser Direct-Write of metal patterns for interconnects and antennas" SPIE Proc. vol. 4977, p. 60.

(Continued)

*Primary Examiner*—Hung V. Ngo
(74) *Attorney, Agent, or Firm*—John J. Karasek; Joseph T. Grunkemeyer

(57) ABSTRACT

A method is provided for embedding electronic components including electrochemical cells within a circuit board substrate. The method includes micromachining the printed circuit board substrate to a selective depth to form a recess. A component is inserted into the recess and an electrical connection is established between the electrical component and a metallized pattern of the circuit board substrate using, e.g., laser direct-write.

24 Claims, 3 Drawing Sheets

OTHER PUBLICATIONS

A. Piqué, C.B. Arnold, H. Kim, M. Ollinger and T.E. Sutto, "Rapid prototyping of micro-power sources by laser direct-write", Appl. Phys. A, vol. 79, p. 783 (2004).

C.B. Arnold, R.C. Wartena, K.E. Swider-Lyons and A. Piqué, "Direct-Write Planar Microultracapacitors by Laser Engineering", J. Electrochem. Soc., vol. 150, p. A571 (2003).

C.B. Arnold, R.C. Wartena, K.E. Swider-Lyons, and A. Piqué, "Fabrication of Mesoscale Energy Storage Systems by Laser Direct-Write"; Mat. Res. Soc. Symp. Proc. vol. 758, page.

* cited by examiner

LASER-BASED TECHNIQUE FOR PRODUCING AND EMBEDDING ELECTROCHEMICAL CELLS AND ELECTRONIC COMPONENTS DIRECTLY INTO CIRCUIT BOARD MATERIALS

This application claims priority from Provisional Application No. 60/478,471, filed Jun. 11, 2003. Provisional Application No. 60/478,471 is hereby incorporated by reference.

FIELD OF THE INVENTION

The present invention relates to electronic devices and components and methods for fabricating electronic devices and components, and in particular, to embedded electronic devices and components and methods for fabricating electronic devices and components by embedding an electrical component in a recess formed in a circuit board substrate.

BACKGROUND OF THE INVENTION

The size and weight of small, unobtrusive devices is dominated by the size and weight of the internal circuit boards, the electrical components which are mounted on the surface of circuit boards, and by the energy storage devices such as batteries that supply the power to the various electronic components. The surface area of the internal circuit board is considered very valuable as there is only a finite amount of space for adding components. Of course, as components are added to the internal circuit board, the height and mass of the device increases.

In order to address the dimensional limitations of electronic devices, previous techniques, such as the use of thin film printing techniques as well as techniques for embedding electronic components in to a circuit board, have been developed to reduce the thickness of electronic components. However, previous techniques for embedding components have relied primarily on the addition of material around the discrete electronic components, thereby effectively building a laminated circuit board from the bottom up.

These prior art approaches are inherently limited as they require special development and optimization for each individual circuit design, involve a significant cost increase to circuit board manufactures and reduce the ability to add additional components to an existing circuit board or modify the circuit design.

SUMMARY OF THE INVENTION

The present invention relates to a method for embedding electronic components including electrochemical cells into a circuit board. The method can be adapted to use a standard commercially available circuit board which is then micromachined, in one embodiment using a laser, for example, to form a recess to a controlled depth. The recess provides a location within the thickness of the circuit board for a thin, electronic component. After micromachining, the electric component or components such as, for example, a surface mount capacitor or resistor, are placed in the machined region of the circuit board. Electrical contacts to the component are made using a non-contact, low-temperature, direct-write technique that connects the surface mount component disposed in the machined region to metallized patterns on the circuit board. One important feature of the invention is that the method can be carried out using a single machine, in contrast to prior art methods wherein additional processing steps/machines are required.

In accordance with one aspect form of the present invention, a method is provided for fabricating an electronic device. The method includes providing a substrate having a metallized or conductive pattern on a top surface and micromachining the substrate from the top surface to a selected depth so as to form a first recess in the substrate. At least one electronic component is inserted into the first recess, and electrical connections are established between at least one electrical component and the metallized pattern on the substrate using laser directed writing (or any other method) of conductive material. It will be understood that while in the foregoing description the substrate is described as having a metallized pattern thereon, any conductive pattern can be used and the conductive pattern can, in general, be added at any time.

In accordance with another aspect form of the present invention, a method is provided for fabricating an electronic device which includes providing a substrate having a metallized or conductive pattern on a top surface. The substrate is micromachined from the top surface to a selected depth so as to form a recess in the substrate, and conductive material is deposited into the recess to form a first conductive line. A dielectric material is added into the recess on top of the conductive line and a second conductive line is written on the dielectric material using laser (or other means of) directed writing of conductive material. In one embodiment, this method is used for the fabrication of embedded waveguides for the transmission of RF signals and also for other RF structures.

According to yet another aspect of the invention, there is provided an embedded electronic device which comprises a substrate having a metallized pattern on a top surface. A micromachined first recess is formed in the substrate and at least one electronic component is disposed in the first recess. An electrical connection connects at least one electronic component and the metallized pattern together.

One important feature of the invention is that it allows the embedding of dissimilar components such as passive and active electronic components as well as electrochemical cells using a common approach or method.

Further features and advantages of the present invention will be set forth in, or apparent from, the detailed description of preferred embodiments thereof which follows.

DESCRIPTION OF THE PREFERRED EMBODIMENTS

The present invention will now be described in relation to the preferred embodiments thereof as depicted in the several figures wherein similar components have the same reference number increased by one hundred so as to correspond with the figure number.

Figure 1:
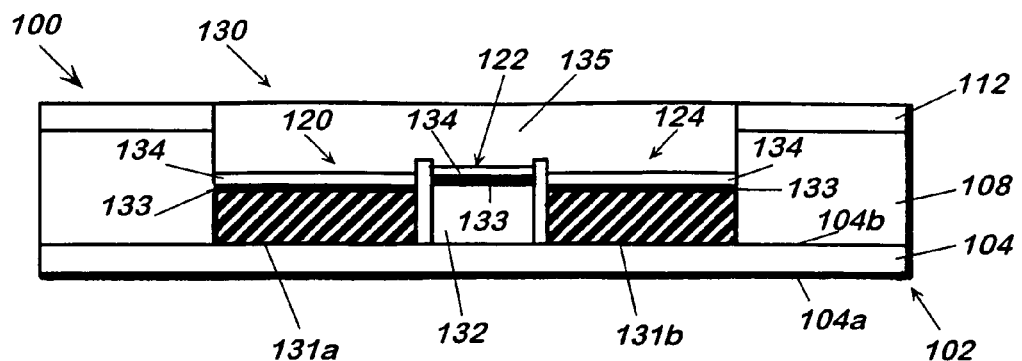
FIG. 1 is a cross-section schematic view of an embedded electronic component in the form of an electrochemical cell in accordance with one embodiment of the present invention.

Referring now to FIG. 1, device 100 includes an electrochemical cell formed in a circuit board substrate 102. Substrate 102 can, for example, be any suitable circuit board, including but not limited to, metals, semiconductors, insulators, ceramics, and multilayered structures which include previously embedded structures. Advantageously, the substrate 102 may be chemically resistant and have low processing temperatures such as is characteristic of many plastics or commonly available circuit board materials. The shape of the substrate 102 although depicted as planar, may be of any arbitrary three-dimensional shape, including planar, spherical or complex curved.

Substrate 102 includes a bottom metallic layer 104 having an exterior surface 104a and interior surface 104b, an intermediate insulating layer 108 and a top surface layer 112 which includes a metallized pattern. The metallized pattern includes but is not limited to passive and active electronic circuits or opto-electronic circuits.

The top surface 112 is micromachined to form multiple adjacent recesses 120, 122, and 124. A micromachining system suitable for forming the recesses 120, 122, and 124 includes an apparatus which can remove top surface 112 and insulating material which composes intermediate layer 108. Advantageously, this can be done by using a dual-laser system in which one high peak-power (pulsed) laser removes the metallic material and a second pulsed or cw laser, operating at a different wavelength, removes the insulating material either solely or with the aid of the first laser. The laser beams from the two lasers co-propagate along or nearly along the same optical axis towards the sample. A second laser operating in pulsed mode and at a wavelength with a higher absorption in the insulating material than the first laser can have enough fluence to completely ablate and remove this material. Alternatively, the second laser can operate in cw mode (and also at a different wavelength than the first laser) to convert part or all of the insulating material into a liquid and/or vapor phase before the other high peak-power laser beam arrives to completely remove the material.

One advantage of using the dual-laser system is that the time and spatial offset between the laser pulses coming from each laser is variable in duration and in order. Therefore, the amount and duration of thermal and ablative processes acting on the sample can be controlled. Advantageously, in one preferred dual-laser system, the temperature of the machined substrate 102 is monitored by a temperature sensor whose output is fed back to control the interaction time, and power of the dual-laser system. This feedback is used to prevent catastrophic damage to the substrate during the machining processes.

It will be understood that although the dual laser system has advantages in certain applications (e.g., when used with particular substrate materials), a single laser is, in general, sufficient for the purposes of the invention.

In an alternative method of machining substrate 102 to form the recesses 120, 122, and 124 and depositing material, rather than using laser micromachining, any available machining process known in the art for manufacturing circuit boards may be employed, including but not limited to, mechanical machining or milling, etching, and laser machining combined with an additive direct-write process which includes ink-jet, micro-pen and laser direct-write.

After the recesses 120, 122, and 124 are formed, individual electronic components are inserted into the recesses 120, 122, and 124 to form an electrochemical cell 130. First, electrically conductive materials are deposited in the recesses 120, 122, and 124 to form an electrochemical cathode 131a, 131b and anode 132. Electrochemically active material 133 is deposited on cathode 131a, 131b and anode 132, and an electrolyte material 134 is deposited on top of the electrochemically active material 133. The electrolytic material 134 can be either a solid or an aqueous material. Finally, an encapsulating potting material 135 is deposited over the electrolytic material 134.

It will be understood that in a workable implementation the metallized layer 104 would not short circuit the anode region 132 and cathode regions 131a, 131b as appears to be shown in FIG. 1. In practice, the metallized layer 104 is machined or patterned such that the anode 132 and cathode 131a, 131b are electrically isolated. Thus, in FIG. 1, material (not shown) would be removed from layer 104 below the separating walls between anode 132 and cathode 131a, 131b.

It will also be appreciated that the order of formation described above (cathode, then separator and then anode) can be reversed so that the anode is formed first, then the substrate and finally the cathode. Alternatively, the entire final sample can be "dipped" in a liquid (e.g., a thermosetting or thermoplastic liquid or the like) which would completely seal and cover up the embedded components upon drying.

Figure 2:
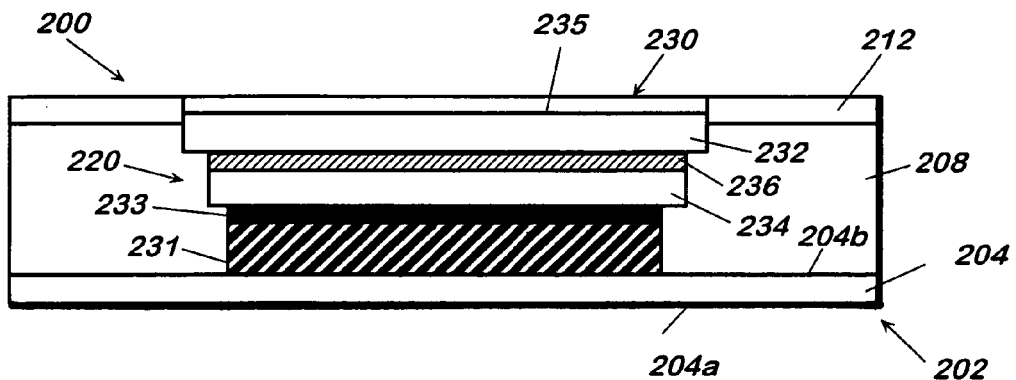
FIG. 2 is a cross-section schematic view of another electrochemical cell in accordance with a further embodiment of the present invention.

Referring now to FIG. 2, an alternative electrochemical cell is fabricated using the present method in which electronic device 200 comprises a circuit board 202 in which recess 220 is micromachined from top surface 212 through intermediate insulating layer 208 to an interior surface 204b of a bottom metallic layer 204 which also has an exterior surface 204a. In forming recess 220, the circuit board 202 is micromachined using a dual wavelength laser which incorporates ultraviolet laser light and infrared laser light to remove substrate materials of the intermediate insulating layer 208 and top layer 212 in a method similar to the one used in accordance with the embodiment depicted in FIG. 1.

An electronic component in the form of electrochemical cell 230 is inserted into the recess 220 by depositing a single multilayer film which comprises layers of a current collector 231, an electrochemically active material 233, an electrolyte 234, a second electrochemically active material 236, a second current collector 232 and an encapsulating material 235. The first current collector 231 layer forms a cathode and the second current collecting layer 232 forms the anode of the embedded electrochemical cell 230.

It is pointed out that the drawing in FIG. 2 can be simplified. Because the circuit board is metallized, element 231 can be viewed as the electrochemically active materials, elements 233, 234 and 236 lumped together as the electrolyte/separator, 232 as the other electrochemical material and 235 as the current collector. In this case the current collector acts as the encapsulating material.

Examples of some electrochemical cells which can be embedded using the present method include hydrous ruthenium oxide supercapacitors, lithium-ion batteries and other alkaline cells.

Figure 3:
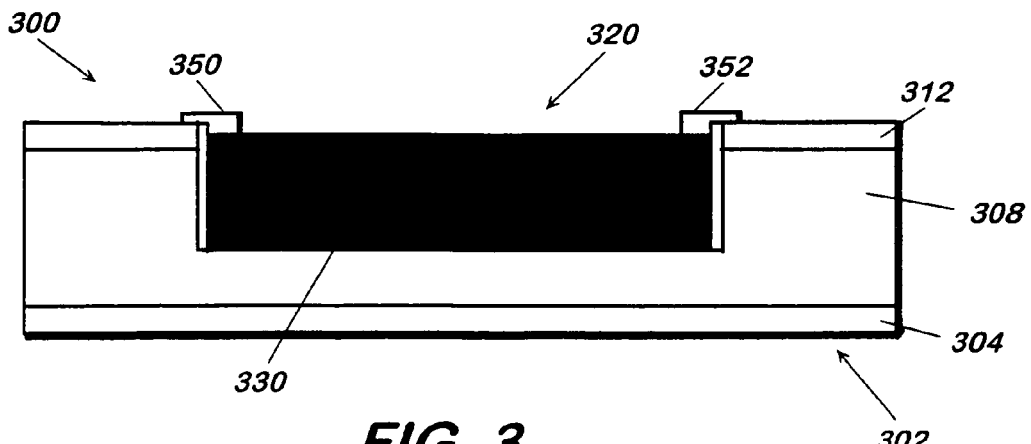
FIG. 3 is a cross-section schematic view of an embedded surface mount electronic component in accordance with another embodiment of the present invention.

Referring now to FIG. 3, the present method may be used to form the electronic device 300 which includes an embedded surface mount component 330. The electronic component 300 is formed in substrate 302 which includes bottom layer 304, intermediate insulating layer 308 and top surface 312 having a metallized pattern. Recess 320 is formed by micromachining using the technique described above with regard to the embodiments of FIGS. 1 and 2. The surface mount component 330 is embedded or inserted into recess 320 as a complete electronic or opto-electronic component. Subsequently, connection tabs 350 and 352 are deposited on the electronic device 300 by laser direct-write deposition of metal or conductive ink, although other methods can also be used. The connection tabs 350, 352 provide an electrical connection between the surface mount component 320 and the metallized pattern present on the top surface 312.

The surface mount component 330 may be any known electronic or opto-electronic component known to one of ordinary skill in the art which can be embedded into the recess of a circuit board machined as described herein. Such components include but are not limited to a capacitor, resistor, inductor, active device such as LEDs, diodes, transistors and other semiconductor devices, microdevices such as MEMS or MOEMS, or IC dies and other RF components.

Figure 4:
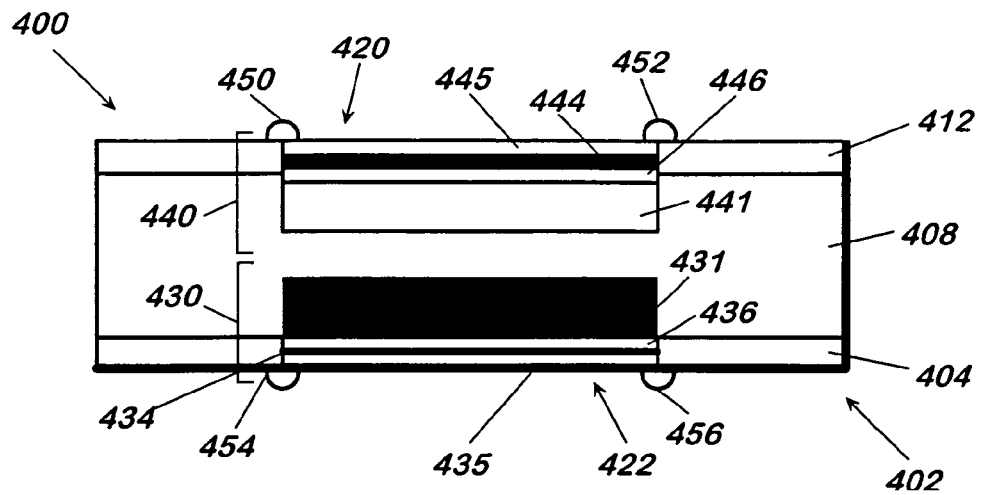
FIG. 4 is a cross-section schematic view of a stacked electronic component in accordance with yet another embodiment of the present invention.

Referring now to FIG. 4, the present method is used to form an electronic device 400 which includes a stacked structure formed from two multilayer films 430, 440. The electronic device 400 is formed by micromachining two recesses 420, 422 in the top surface 412 and bottom layer 404, respectively, using the method described above with regard to the embodiments of FIGS. 1 and 2. A single multilayer film 430, 440 is inserted into recesses 420, 422, respectively. The multilayer film 430, 440 is composed of layers: current collection layer 431, 441 electrochemically active layer 436, 446, electrolyte layer 434, 444 and encapsulating layer 435, 445. Current collector 431 forms a cathode and current collector 441 forms an anode. The intermediate substrate 408 acts as a separator between the cathode and the anode.

Viewing FIG. 4 differently, 441 and 431 could be the electrochemically active materials and 436 and 446 the current collectors; separate electrolyte layers are not actually necessary in that the electrolyte is mixed in with the electrochemically active materials.

Next, metallic connection tabs 450, 452 and 454, 456 are deposited on films 440, 430, respectively, so as to make contact with the rest of the circuit board 402 and in particular a metallized pattern on the top surface 412 and a metallized pattern in bottom layer 404, respectively. The metallic connection tabs 450, 452, 454, and 456 are preferably deposited using the same method described above with regard to the device 300 of FIG. 3.

Figure 5:
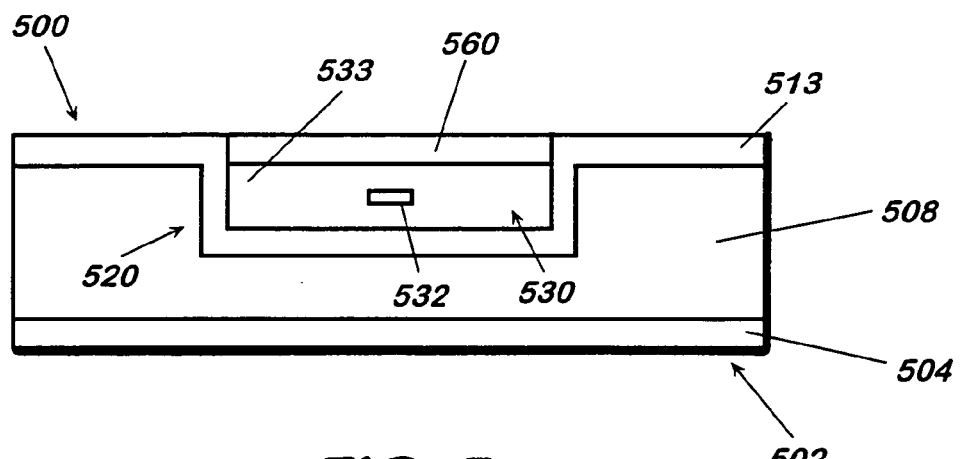
FIG. 5 is a cross-section schematic view of an embedded coaxial waveguide electronic component.

Referring now to FIG. 5, an electronic device 500 is provided which preferably comprises an embedded coaxial waveguide or stripline or transmission line, indicated generally at 530.

The device 500 is fabricated by first forming recess 520 by micromachining through the substrate layer 508 of the circuit board substrate 502. Next, insulating layer 513 is deposited over the substrate including in the recess 520. Then a complete coaxial waveguide 530 which includes a feed line 532 and dielectric material 533 is inserted into recess 520. Subsequently, a second conductive line 560 is laser written on the dielectric material 533 of the coaxial waveguide 530 within the recess 520.

It will be appreciated that the specific embodiment shown in FIG. 5 is an inverted microstrip line. By changing layer 513 (or at least the portion thereof in recess 520) to metal, a coaxial waveguide or stripline transmission line results. With additional layers, an embedded coplanar waveguide or coplanar strip transmission line is produced. Thus, it will be understood that the invention is not in any way limited to the specific embodiment illustrated in FIG. 5.

Figure 6:
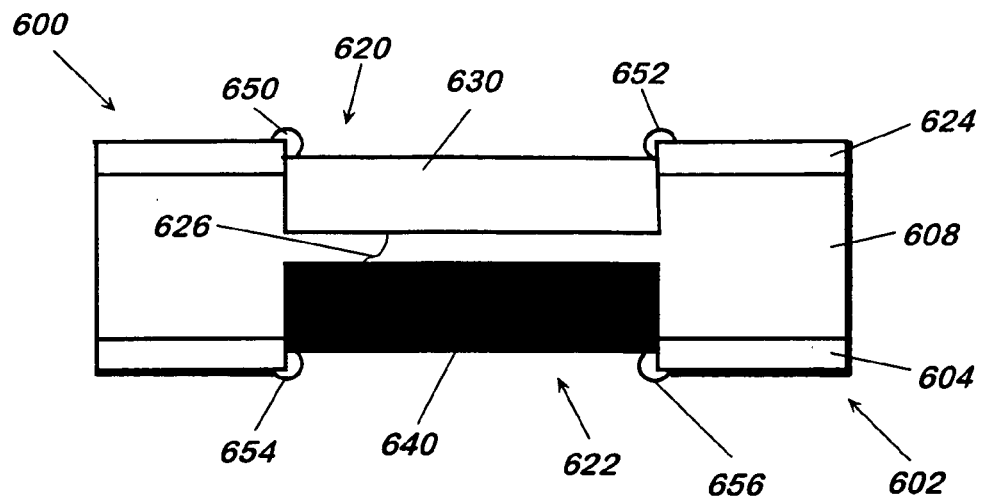
FIG. 6 is a cross-section schematic view of a stacked two-component embedded electronic component device.

Referring now to FIG. 6, in yet another embodiment, device 600 is formed in circuit board substrate 602 having recess 620 micromachined through a top surface 624 and a second recess 622 formed through bottom layer 604 in accordance with the method described above with regard to device 100.

An electronic component 630 is inserted in recess 620 and electronic component 640 is inserted in recesses 622. A via 624 is formed in the intermediate layer 608 separating the recesses 620 from recess 622 using any conventional via fabrication method known in the art. Electrical connection 626 electrically couples electronic component 630 with the electronic component 640.

Metallic connection tabs 650, 652 and 654, 656 are deposited using the same method as described above with regard to device 300 of the embodiment depicted in FIG. 3.

Figure 7:
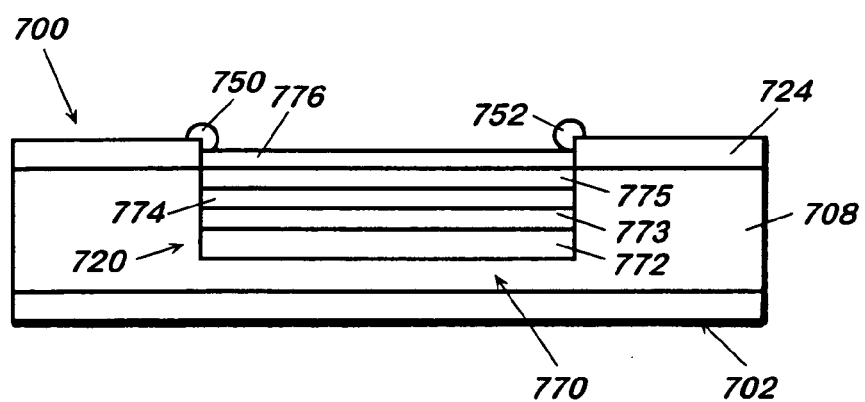
FIG. 7 is a cross-section schematic view of an embedded multilayered electronic component in accordance with a further embodiment of the present invention.

Referring now to FIG. 7, electronic device 700 is formed in circuit board substrate 702 which has a recess 720 formed therein using the method described above with regard to the embodiment depicted in FIG. 1. An electrically conductive layer 772, an electrically insulating layer 773, an electrically conducting layer 774, an electrically insulating layer 775, and an electrically conducting layer 776 are deposited in order in the recess 720. Metallic connection tabs 750, 752 are formed using non-contact, low-temperature, laser (or non-laser) direct-write technique to conductively connect the component 770 to the metallized pattern on the top surface 724 of the circuit board substrate 702.

In an alternative embodiment of the one shown in FIG. 7, rather than depositing electrically conducting material 772, layer 772 may alternatively be a resistive, semiconducting, piezoelectric, dielectric, ferrite or any other type of depositable material known in the art and in keeping with the spirit and scope of the present method.

Referring to any of the embodiments, the present laser micromachining method is adapted to micromachine to a particular depth which if desired can remove all circuit board material and leave only exposed the metallic layer from a bottom layer of a circuit board. Such is the case in the electronic device 200 of FIG. 2. Subsequently, interconnects can be made through the resulting circuit board using low temperature laser or other direct-write techniques described herein to make contact between both sides of the circuit board, i.e., from both bottom layer 204 and top surface 212. For example, this technique may be used for radio frequency (RF) and antenna applications.

In addition, the present method may be adapted to form a recess for components on opposite sides of a single substrate which may be either electrically isolated from one another or electrically connected through conductive vias or through holes.

Further, the present method may be adapted for use with particularly porous circuit board materials where the circuit boards can be presoaked with a polymer solution to fill in pores making the circuit board more able to contain aqueous components of electrochemical cells.

In order to provide a better understanding of the present method, the following non-limiting embodiments provide further examples of modifications and adaptations of the present method and resulting electronic and electrochemical cells formed using the various adaptations of the present method.

The present method may be used for forming an embedded transmission line within a substrate which includes micromachining a substrate to form a recess, depositing an electrically conducting layer in the recess, depositing an electrically conducting material, depositing an additional insulting material and depositing additional conductive material.

The present method may be adapted to make an embedded antenna or transmission line within a substrate which includes micromachining the substrate to form a recess, depositing electrically conducting, resistive, superconducting, piezoelectric, dielectric, ferrite or any other type of material into the recess, and depositing an encapsulating material into the recess.

Further, the present method may be used for forming an embedded sensor within a substrate which includes micromachining a substrate to form a recess, depositing a sensor material into the recess, depositing one or more electrical contacts into the recess, depositing selective porous encapsulating material into the recess.

As should now be apparent to one of ordinary skill in the art, the present method may be used to form an electronic device having an electronic component which includes but are not limited to an alkaline battery, lithium battery, ultracapacitor, transmission line or strip, resonator, passive or active antenna, sensor, and a passive and active electronic circuit or opto-electronic circuit.

Further, the present method may be adapted to remove and add components at various locations on a substrate using the present laser system.

As will be further apparent to one of ordinary skill in the art, the present method provides features and advantages not present in prior methods. For example, the present method provides for embedding electronic components, such as electrochemical cells to reduce the size and weight of devices utilizing circuit boards or other substrates with surface mount components. By directly embedding the electronic component into the circuit board, the resulting device is more autonomous while having a lower profile. Unlike prior devices wherein components are embedded directly into circuit boards and materials are added to the surface to build up a component in and around the circuit board, the present method provides for using any currently available circuit board or substrate and modifying that board as necessary to embed the component using techniques including both the removing of portions of the existing circuit board using micromachining and then building up other portions of that circuit board using laser writing or other means of direct writing.

Further, using the present laser micromachining process, one is able to accurately control the depth by which one produces a recess in the circuit board substrate. Further, using the present laser direct-write process, one can add metallic conducting lines above an embedded element to make electric contact to the rest of the circuit board.

An additional feature and advantage of the present method is provided through using a low temperature process for making electrical contact.

Further, the present method can produce electrochemical cells which may be either layered or planar structures embedded within the circuit board material.

A further feature relates to now being able to embed electrochemical cells having aqueous electrolyte material whereas prior techniques for embedding electrochemical cells permitted only solid electrolytes.

In addition, unlike prior embedded electrochemical cells which required large areas, the present method provides for a reduction in size of these components to a sub-millimeter scale.

Further, the present method in one form or embodiment uses a dual wavelength laser to accurately micromachine and remove circuit board material down to the metal layer of the bottom surface of a circuit board. Prior techniques have used screen printing and contact methods for adding material to existing circuit boards but these methods are not viable for use on existing circuit boards with attached components. However, the present method provides for adding material which is non-contact and conformable so one can add material on almost any circuit board substrate.

In addition, the present method allows for laser direct-write technique for adding material directly where required thus eliminating the need for lithography or patterning. Further, the present laser machining and laser direct-write deposition have advantages over other prior non-lithographic techniques in that the present laser machine and laser direct-write deposition provides for higher resolution such as around approximately 10 micrometers.

Although the invention has been described above in relation to preferred embodiments thereof, it will be understood by those skilled in the art that variations and modifications can be effected in these preferred embodiments without departing from the scope and spirit of the invention.

What is claimed:

1. A method for fabricating an electronic device, said method comprising the steps of:
   providing a substrate having a top surface;
   micromachining the substrate from the top surface to a selected depth so as to form a first recess in the substrate;
   inserting at least one electronic component into the first recess;
   establishing an electrical connection between the at least one electrical component and a conductive pattern provided on the top surface of the substrate, using laser directed writing of conductive material.

2. The method of claim 1, wherein the at least one electronic component comprises an electrochemical cell.

3. The method of claim 2, wherein said inserting step comprises inserting a film comprising layers of an electrochemically active material, an electrolyte, a current collector and an encapsulating material.

4. The method of claim 2, wherein said inserting step comprises inserting a film comprising layers of a first current collector, a first electrochemically active material, a first electrolyte or separator, a second electrochemically active material, a second current collector, and an encapsulating material.

5. The method of claim 2, wherein said inserting step comprises depositing an electrically conductive material into said first recess, depositing an electrochemically conductive material into said first recess so as to form a current collector, depositing an electrochemically active material in the first recess, adding an electrolyte material to the first recess, and depositing an encapsulating material into the recess.

6. The method of claim 5, further comprising micromachining a second recess from the top surface adjacent to the first recess and depositing an electrically conductive material in the second recess to form a second current collector, depositing an electrochemically conductive material in the second recess, depositing an electrochemically active material in the second recess, adding an electrolyte material to the second recess and depositing an encapsulating material in to the recess.

7. The method of claim 1, wherein the at least one electrical component is selected from the group consisting of a capacitor, an inductor and a resistor.

8. The method of claim 1 wherein said inserting step comprises inserting a complete electronic or opto-electronic device into the recess.

9. The method of claim 1, wherein the at least one electronic component comprises a transmission line.

10. The method of claim 9, wherein said inserting step comprises depositing a first electrically conducting layer in the recess, depositing a first electrically insulating layer in the recess on top of the first electrically conducting layer, depositing a second electrically conducting layer on the first insulating layer, depositing a second insulating layer on the second electrically conducting layer, and depositing a third conducting layer on the second insulting layer.

11. The method of claim 1, wherein said inserting step comprising depositing one of an electrically conducting material, a resistive material, semi-conducting, a piezoelectric material, a dielectric material, and a ferrite material in the recess and depositing an encapsulating material in the recess.

12. The method of claim 1, wherein said inserting step comprises depositing a sensor material in the recess, depositing electrical contacts, and depositing selectively porous encapsulating material.

13. The method of claim 1, wherein the substrate has a bottom metallic layer on a side opposite the top surface, the bottom metallic layer having an exterior surface facing away from the substrate and an interior surface facing toward an interior portion of the substrate; and said micromachining step comprises micromachining from the top surface, into the substrate, up to the interior surface of the bottom metallic layer.

14. The method of claim 13, further comprising establishing an electrical interconnection through the bottom metallic layer using laser directed writing of conductive material to thereby establish the electrical interconnection through the substrate.

15. The method of claim 1, wherein said inserting at least one component step comprises inserting at least two electronic components in the recess.

16. The method of claim 15, wherein a second of the two electronic components is stacked on a first of the two electrical components.

17. The method of claim 16, wherein said establishing electrical connection step comprises establishing an electrical connection between the second electronic component and the metallized pattern of the substrate using a laser directed writing of conductive material.

18. The method of claim 1, wherein said micromachining step comprises micromachining the substrate using a laser.

19. The method of claim 18, wherein the laser comprises a dual wavelength laser system including a first laser having an ultraviolet wavelength and a second laser having an infrared wavelength.

20. The method of claim 1, further comprising micromachining the substrate from a bottom surface of the substrate to form a second recess.

21. The method of claim 20, wherein said inserting step comprising depositing one of an electrically conducting, resistive, semi-conducting, piezoelectric, dielectric, and ferrite material in the recess and depositing an encapsulating material in both the first recess and the second recess.

22. The method of claim 20, further comprising establishing an electrical interconnect between the two recesses.

23. The method of claim 1, further comprising micromachining a substrate from the top surface to form a second recess adjacent to the first recess.

24. A method for fabricating an electronic device, said method comprising the steps of:

providing a substrate having a top surface thereof;

micromachining the substrate from the top surface to a selected depth so as to form a recess in the substrate;

depositing conductive material into the recess to form a first conductive line;

adding dielectric material into the recess on top of the conductive line; and writing a second conductive line on the dielectric material using laser directed writing of conductive material.

* * * * *